(12) United States Patent
Sumi (10) Patent No.: US 11,029,672 B2
(45) Date of Patent: Jun. 8, 2021

(54) MANUFACTURING SYSTEM AND METHOD OF GRANTING AUTHORITY

(71) Applicant: Panasonic Intellectual Property Management Co., Ltd., Osaka (JP)

(72) Inventor: Hideki Sumi, Fukuoka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/142,099

(22) Filed: Sep. 26, 2018

(65) Prior Publication Data
US 2019/0107829 A1   Apr. 11, 2019

(30) Foreign Application Priority Data

Oct. 10, 2017  (JP) .............................. JP2017-196512

(51) Int. Cl.
   *G05B 19/418*   (2006.01)
(52) U.S. Cl.
   CPC .............. *G05B 19/4188* (2013.01); *G05B 2219/32222* (2013.01); *G05B 2219/45029* (2013.01); *G05B 2219/45031* (2013.01)
(58) Field of Classification Search
   None
   See application file for complete search history.

(56) References Cited

U.S. PATENT DOCUMENTS

| 5,564,183 A * | 10/1996 | Satou | B23K 31/12 29/840 |
|---|---|---|---|
| 2003/0098798 A1 | 5/2003 | Kato | |
| 2004/0153868 A1* | 8/2004 | Nonaka | G06Q 10/10 714/47.2 |
| 2016/0078396 A1* | 3/2016 | Kamioka | G05B 23/0208 455/456.1 |
| 2017/0231127 A1* | 8/2017 | Oohori | H05K 13/046 |

FOREIGN PATENT DOCUMENTS

| CN | 105074599 A | 11/2015 | |
|---|---|---|---|
| EP | 2916188 A1 * | 9/2015 | ........... H05K 13/083 |
| JP | 2003-204199 A | 7/2003 | |

OTHER PUBLICATIONS

English Translation of Chinese Search Report dated Mar. 3, 2021 for the related Chinese Patent Application No. 201811144332.1.

* cited by examiner

*Primary Examiner* — Kenneth M Lo
*Assistant Examiner* — Istiaque Ahmed
(74) *Attorney, Agent, or Firm* — Pearne & Gordon LLP (57) ABSTRACT

A manufacturing system includes a plurality of manufacturing facilities, a remote terminal, and a remote authority controller that controls authority of a remote operation from the remote terminal. When an error is detected in a first manufacturing facility out of the plurality of manufacturing facilities, the remote authority controller grants authority of a remote operation of a second manufacturing facility to the remote terminal. The second manufacturing facility causes the error and is other than the first manufacturing facility.

14 Claims, 6 Drawing Sheets

MANUFACTURING SYSTEM AND METHOD OF GRANTING AUTHORITY

BACKGROUND

1. Technical Field

The present disclosure relates to a manufacturing system including a plurality of manufacturing facilities capable of remote operation and a method of granting authority.

2. Description of the Related Art

A component mounting line configured by connecting a plurality of manufacturing facilities such as solder printing machine, a post-printing inspection machine, a component mounting machine, and a post-mounting inspection machine is a manufacturing system for manufacturing a mounting substrate on which components are mounted on a substrate. In such a component mounting line, in addition to on-site operations in which a site operator directly operates an operation panel provided in a manufacturing facility for performing various site operation such as component replenishment and device error corresponding, a component mounting system capable of remotely operating the manufacturing facility by a manager from a management device such as an external PC or the like other than the manufacturing facility is proposed (for example, Japanese Patent Unexamined Publication No. 2003-204199).

SUMMARY

According to the present disclosure, there is provided a manufacturing system including a plurality of manufacturing facilities, a remote terminal, and a remote authority controller that controls authority of a remote operation from the remote terminal, in which when an error is detected in a first manufacturing facility out of the plurality of manufacturing facilities, the remote authority controller grants authority of a remote operation of a second manufacturing facility to the remote terminal. The second manufacturing facility causes the error and is other than the first manufacturing facility.

According to the present disclosure, there is provided a method of granting authority in a manufacturing system including a plurality of manufacturing facilities and remote terminal, the method including monitoring an occurrence of an error in the plurality of manufacturing facilities and granting, when an error is detected in a first manufacturing facility out of the plurality of manufacturing facilities, authority of a remote operation of a second manufacturing facility to the remote terminal. The second manufacturing facility causes the error and is other than the first manufacturing facility. With the present disclosure, it is possible to smoothly execute a remote operation when the error is detected.

DETAILED DESCRIPTIONS

In the conventional component mounting system including Japanese Patent Unexamined Publication No. 2003-204199, when an error occurs in a specific facility, an operator at the site contacts a manager by telephone communication or the like, and the manager specifies a target facility in accordance with a contact so as to perform remote operation, and there is room for further improvement in order to smoothly execute error corresponding.

An object of the present disclosure is to provide a manufacturing system capable of smoothly executing a remote operation when an error is detected and a method of granting authority.

Hereinafter, an example of the present disclosure will be described with reference to drawings. Configurations, shapes, and the like described below are examples for explanation, and can be appropriately changed in accordance with the specifications of a component mounting system. Hereinafter, the same reference numerals are given to the corresponding elements in all drawings, and redundant explanations are omitted.

First, a configuration of component mounting system 1 will be described with reference to FIG. 1. Component mounting system 1 is a manufacturing system having a configuration in which component mounting line L1 is connected by communication network 2, and the whole is managed by management computer 3. Component mounting line L1 includes substrate supplying device M1, solder printing machine M2, post-printing inspection machine M3, substrate transfer device M4, component mounting machines M5 to M8, substrate transfer device M9, post-mounting inspection machine M10, reflow device M11, and substrate recovery device M12 connected in series from the upstream side to the downstream side in the substrate transfer direction.

Figure 1:
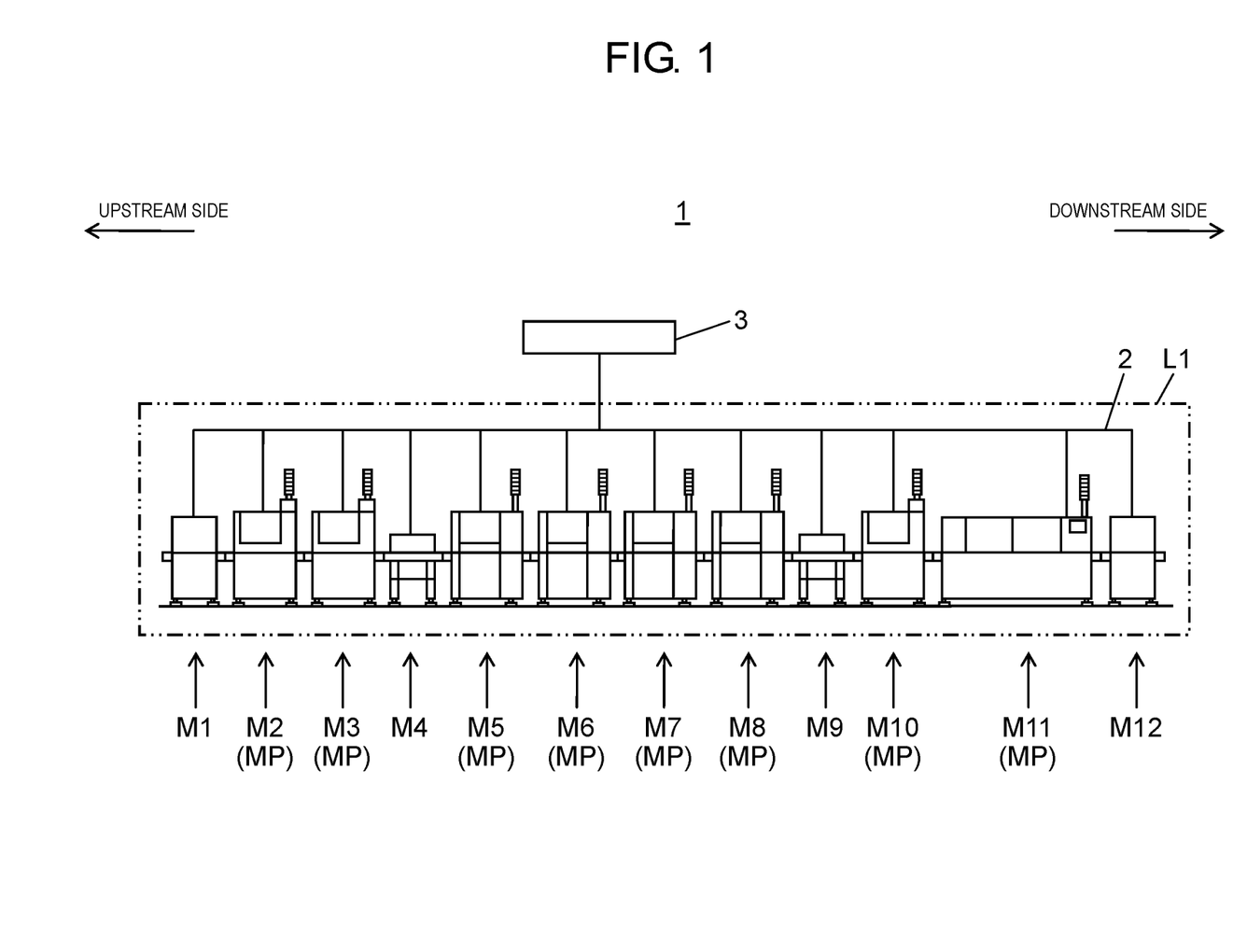
FIG. 1 is a configuration explanatory diagram of a component mounting system according to an embodiment of the present disclosure.

In FIG. 1, substrate supplying device M1 has a function of supplying a substrate to be mounted. Substrate transfer devices M4 and M9 have a function of receiving a substrate from an upstream side device and delivering the substrate to a downstream side device. Substrate recovery device M12 has a function of recovering the substrate on which the component is mounted. In this manner, substrate supplying device M1, substrate transfer devices M4 and M9, and substrate recovery device M12 do not perform the component mounting operation on the substrate transported in component mounting line L1, supply the substrate to manufacturing facility MP, deliver the substrate, and recover the substrate.

Solder printing machine M2 is manufacturing facility MP that performs a solder printing operation (a component mounting operation) for printing a solder on a substrate to be mounted by a solder printing operation unit (operation unit). Post-printing inspection machine M3 is manufacturing facility MP that performs a post-solder printing inspection operation (component mounting operation) for inspecting the printing state of the solder printed on the substrate by the post-solder printing inspection operation unit (operation unit) including a solder inspection camera. Each of component mounting machines M5 to M8 is manufacturing facility MP that performs a component mounting operation (component mounting operation) for mounting components on a substrate by a component mounting operation unit (operation unit).

Post-mounting inspection machine M10 is manufacturing facility MP that performs a post-component mounting inspection operation (component mounting operation) for inspecting the mounting state of the components mounted on the substrate by the post-component mounting inspection operation unit (operation unit) including a component inspection camera. Reflow device M11 is manufacturing facility MP that heats the substrate transferred in the device by a substrate heater (operation unit), hardens the solder on the substrate, and performs a substrate heating operation (component mounting operation) for bonding the electrode portion of the substrate and the component.

In this manner, in component mounting system 1, the substrates transported in component mounting line L1 are sequentially subjected to the solder printing operation, the post-solder printing inspection operation, the component mounting operation, the post-component mounting inspection operation, and the substrate heating operation in an order by manufacturing facility MP, and a mounting substrate on which components are mounted via solder is manufactured on the substrate. Component mounting line L1 is not limited to the above configuration, and the number of component mounting machines M5 to M8 may be one or five or more. In addition, in component mounting system 1, a plurality of component mounting lines L1 may be controlled by same management computer 3.

Next, the configuration of the control system of component mounting system 1 will be described with reference to FIG. 2. Here, among component mounting system 1, manufacturing facility MP for performing a component mounting operation and a control system of management computer 3 will be described. Solder printing machine M2, post-printing inspection machine M3, component mounting machines M5 to M8, post-mounting inspection machine M10, and reflow device M11 that are manufacturing facility MP have the same control system configuration except that operation unit 21 that performs the component mounting operation is a solder printing operation unit, a post-solder printing inspection operation unit, a component mounting operation unit, a post-component mounting inspection operation unit, and a substrate heater. Hereinafter, description will be given using component mounting machine M5 as a representative of manufacturing facility MP.

Manufacturing facility MP (component mounting machine M5) includes operation controller 20, operation unit 21, device storage 22, device monitor 23, device input unit 24, device display 25, and device communicator 26. Operation controller 20 controls operation unit 21 based on component mounting data stored in device storage 22, thereby controlling the component mounting operation by manufacturing facility MP. That is, operation controller 20 controls the solder printing operation in solder printing machine M2, controls the post-solder printing inspection operation in post-printing inspection machine M3, controls the component mounting operation in component mounting machines M5 to M8, controls the post-component mounting inspection operation in post-mounting inspection machine M10, and controls the substrate heating operation in reflow device M11.

In addition to the component mounting data, device storage 22 stores error information 22a and operation authority information 22b. In operation authority information 22b, information as to whether manufacturing facility MP holds the site operation authority or whether management computer 3 holds remote operation authority RR is stored. The site operation authority is an authority that enables site operators to perform site operations in manufacturing facility MP. The remote operation authority is a remote operation authority that a remote operator performing operation at management computer 3 (remote terminal) far from manufacturing facility MP can remotely operate manufacturing facility MP via communication network 2 by management computer 3.

Figure 2:
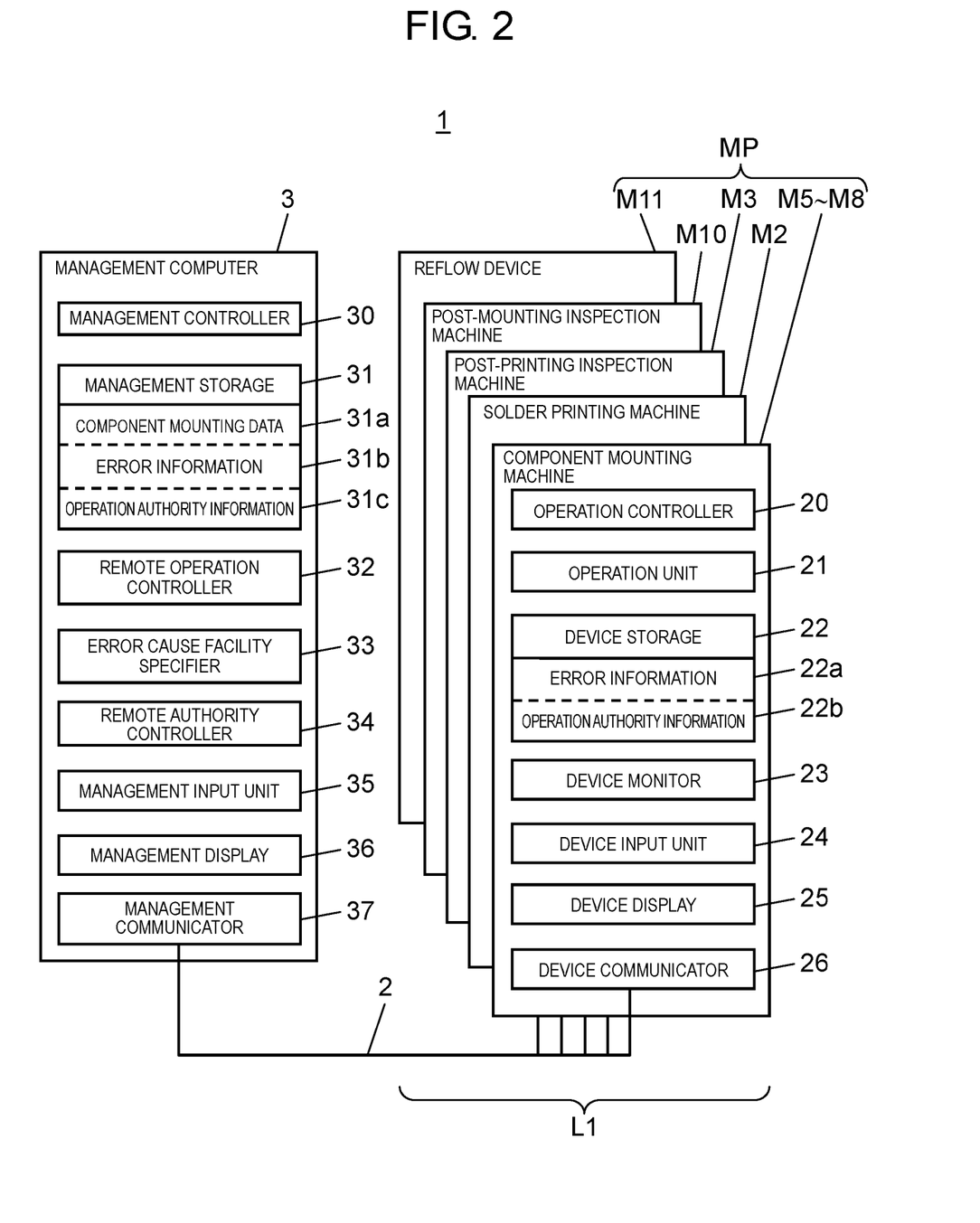
FIG. 2 is a block diagram illustrating a configuration of a control system of the component mounting system according to the embodiment of the present disclosure.

In FIG. 2, device monitor 23 monitors the operation state of operation unit 21 of manufacturing facility MP, the inspection result, output signals of various sensors, and the like, when the device error is detected, stores the error in error information 22a, and transmits the result to management computer 3 via device communicator 26. For example, the device errors of component mounting machine M5 include a component depletion error in which the components supplied by a tape feeder are exhausted, a substrate misalignment error in which the transported substrate is stopped due to deviation from a predetermined substrate stop position, and a component recognition error in which a component expected to be held by a suction nozzle is not detected.

In addition, the device error of post-printing inspection machine M3 includes a solder inspection error in which the printed solder is outside prescribed shape standard or the like and the device error of post-mounting inspection machine M10 includes a mounting inspection error in which the component is not at a predetermined position on the substrate.

Device input unit 24 is an input device such as a keyboard, a touch panel, a mouse, and the like, and is used at the time of inputting operation commands and data by a site operator. Device display 25 is a display device such as a liquid crystal panel and displays various screens such as an operation screen for site operation by device input unit 24. Device communicator 26 is a communication interface and exchanges signals with other manufacturing facilities MP and management computer 3 via communication network 2 (network).

In FIG. 2, management computer 3 includes management controller 30, management storage 31, remote operation controller 32, error causing facility specifier 33, remote authority controller 34, management input unit 35, management display 36, and management communicator 37. Management input unit 35 is an input device such as a keyboard, a touch panel, a mouse, or the like, and is used for remote operation of manufacturing facility MP at the time of inputting operation commands and data. Management display 36 is a display device such as a liquid crystal panel and displays various data as well as an operation screen of each manufacturing facility MP for remote operation. Management communicator 37 is a communication interface, and exchanges signals and data with manufacturing facility MP via communication network 2.

Management controller 30 is an arithmetic unit such as a CPU and controls component mounting system 1 based on the information stored in management storage 31. Management storage 31 is a storage device, and stores component mounting data 31a, error information 31b, operation authority information 31c, and the like. Component mounting data 31a includes a component number for specifying a component to be mounted on the substrate, coordinates of a mounting point of the components, information for specifying component mounting machines M5 to M8 for performing the component mounting operation, and the like and stores the information for each type of the mounting substrate to be manufactured.

In error information 31b, device errors occurred in respective manufacturing facilities MP detected and transmitted by device monitor 23 of each manufacturing facility MP are stored in association with each manufacturing facility MP. For each manufacturing facility MP, operation authority information 31c stores information as to whether the manufacturing facility MP holds the site operation authority or whether management computer 3 holds the remote operation authority of manufacturing facility MP.

In FIG. 2, remote operation controller 32 displays the operation screen of each manufacturing facility MP on management display 36 of management computer 3 for a plurality of manufacturing facilities MP holding the remote operation authority, management input unit 35 of management computer 3 controls manufacturing facility MP to be remotely operated via communication network 2. That is, remote operation controller 32 allows the plurality of manufacturing facilities MP to be operated remotely via communication network 2 by management input unit 35 of management computer 3 (remote terminal) based on operation authority information 31c.

Error causing facility specifier 33 specifies whether the device error stored in error information 31b is caused by manufacturing facility MP (hereinafter referred to as "first manufacturing facility") that has detected the device error, whether it is caused by another manufacturing facility MP other than the detected first manufacturing facility that has detected the device error. In a case where the device error is caused by another manufacturing facility MP, error causing facility specifier 33 specifies another specific manufacturing facility (hereinafter referred to as "second manufacturing facility") which causes the device error. That is, error causing facility specifier 33 specifies the second manufacturing facility that caused the device error.

For example, in the case where the device error is the solder inspection error detected by post-printing inspection machine M3 (first manufacturing facility), error causing facility specifier 33 specifies solder printing machine M2 on which the solder has been printed on the substrate as the second manufacturing facility. In addition, in the case where the device error is the mounting inspection error detected by post-mounting inspection machine M10 (first manufacturing facility), error causing facility specifier 33 specifies any one of component mounting machines M5 to M8 as the second manufacturing facility on which the component is mounted on the substrate based on component mounting data 31a.

In FIG. 2, remote authority controller 34 grants remote operation authority (remote operation authority) of manufacturing facility MP specified by error causing facility specifier 33 to management computer 3 (remote terminal). More specifically, remote authority controller 34 changes operation authority information 31c stored in management storage 31 and operation authority information 22b stored in device storage 22 of specified manufacturing facility MP, thereby controlling the remote operation authority by the remote terminal.

In addition, remote authority controller 34 causes information on the device error detected by the first manufacturing facility to be displayed on management display 36 (display) of management computer 3 (remote terminal). When information of the device error displayed on management display 36 is selected by the remote terminal, remote authority controller 34 changes operation authority information 22b and operation authority information 31c so as to grant the remote operation authority of the second manufacturing facility, which causes the selected device error to the remote terminal. That is, remote authority controller 34 grants management computer 3 the authority of the remote operation of the second manufacturing facility corresponding to the selected information.

Figure 3:
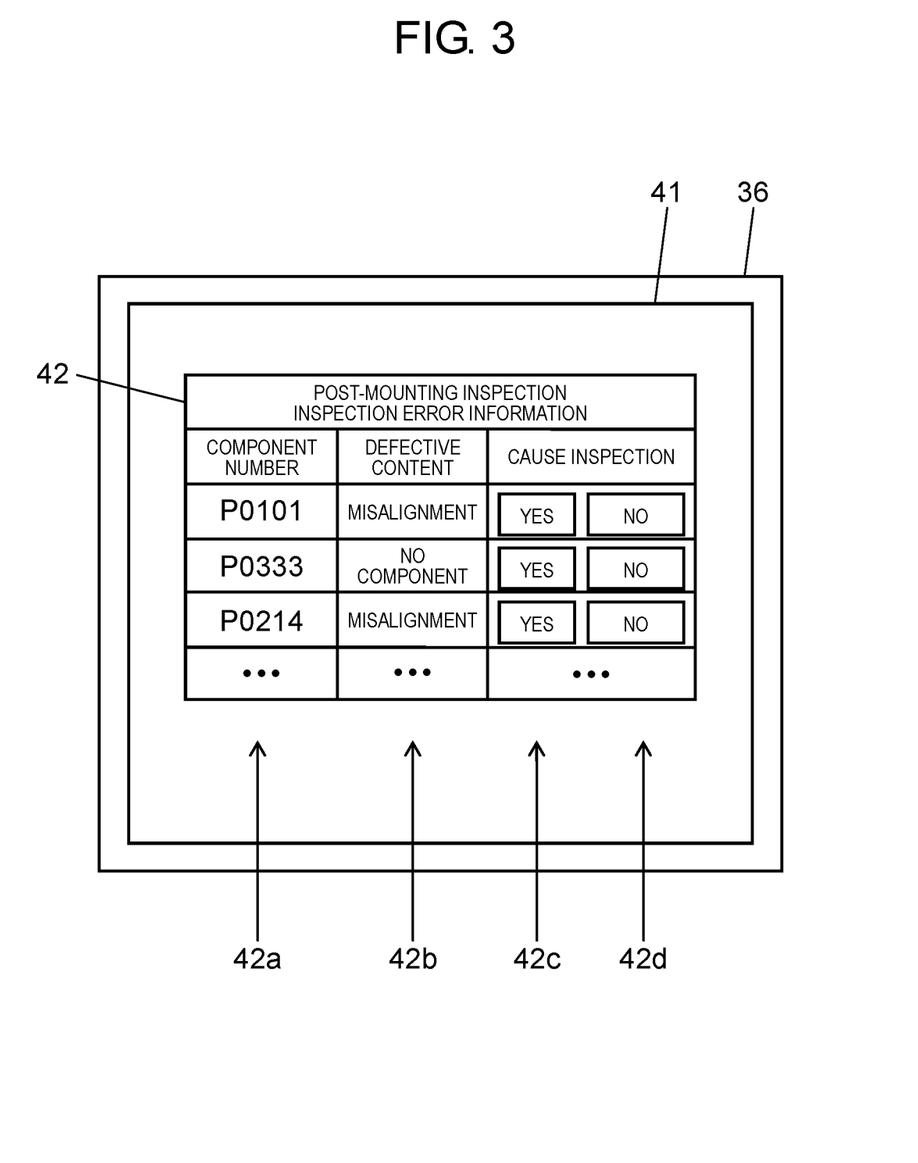
FIG. 3 is an explanatory diagram illustrating an example of a screen displaying a post-mounting inspection result displayed on a display of a remote terminal included in the component mounting system of the embodiment of the present disclosure.

Here, with reference to FIG. 3, information on the mounting inspection error detected by post-mounting inspection machine M10 displayed on management display 36 of management computer 3 by remote authority controller 34 will be described. In FIG. 3, on management display 36, post-mounting inspection result screen 41 is displayed. On post-mounting inspection result screen 41, result display region 42 is displayed. In result display region 42, component number 42a specifying a component detected as a mounting inspection error and detected defective content 42b are displayed. In this manner, remote authority controller 34 causes management display 36 (display) to display information on the device error detected by the first manufacturing facility.

Further, in result display region 42, "Yes" button 42c and "No" button 42d corresponding to the components detected as defective are set. When "Yes" button 42c is operated, the remote operation authority of component mounting machines M5 to M8 (the second manufacturing facility) on which the component is mounted is granted to the remote terminal, the operation screen of the second manufacturing facility is displayed on management display 36 (refer to FIG. 4). When "No" button 42d is operated, the information on the mounting inspection error of the component is removed from result display region 42 without granting the remote operation authority to the remote terminal.

Figure 4:
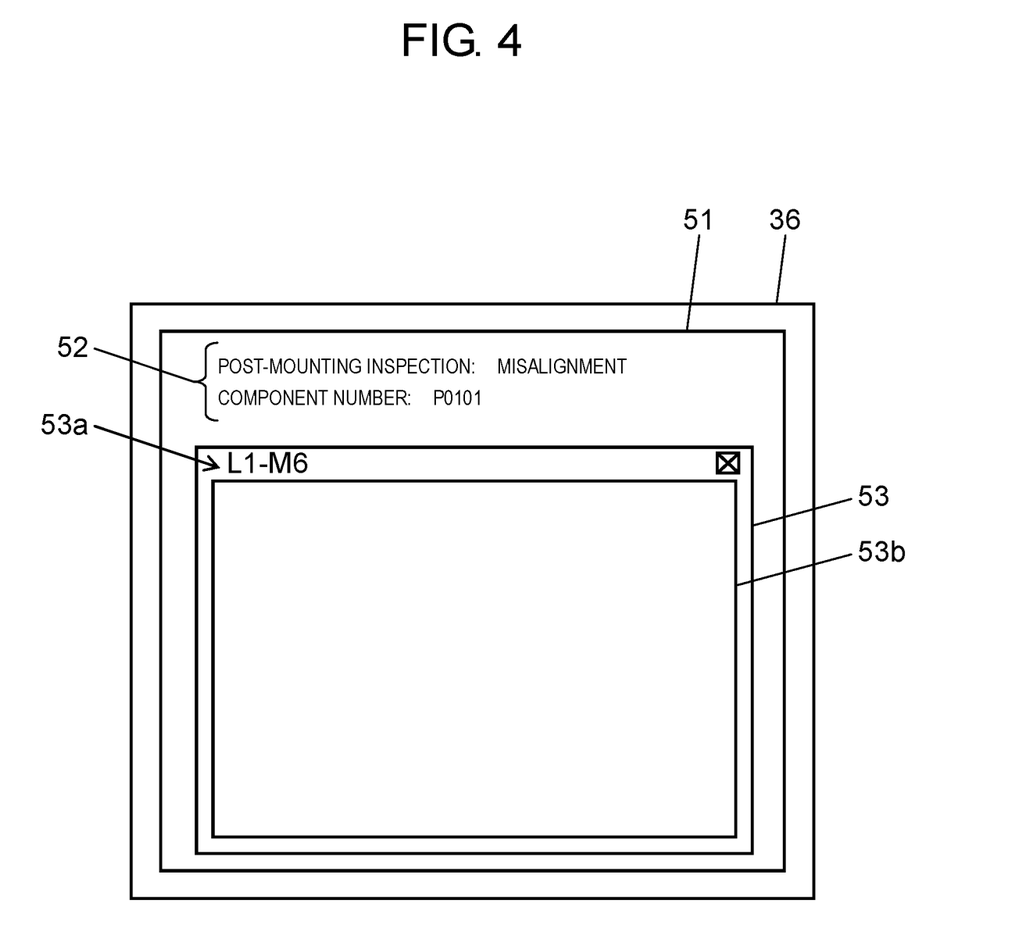
FIG. 4 is an explanatory diagram illustrating an example of a screen for remotely operating a component mounting machine displayed on the display of a remote terminal included in the component mounting system of the embodiment of the present disclosure.

Next, with reference to FIG. 4, a remote operation screen displayed on management display 36 of management computer 3 (remote terminal) will be described. In FIG. 4, remote operation screen 51 for remotely operating component mounting machine M6 is displayed on management display 36.

Mounting inspection error information 52 and screen display frame 53 are displayed on remote operation screen 51. Mounting inspection error information 52 is information of a mounting inspection error detected by post-mounting inspection machine M10 (first manufacturing facility) relating to manufacturing facility MP (second manufacturing facility) to be remotely operated. That is, remote authority controller 34 causes management display 36 (display) to display information on the device error detected by the first manufacturing facility.

In FIG. 4, character 53a ("L1-M6" here) for specifying manufacturing facility MP to be remotely operated is displayed in the upper left part of screen display frame 53. In screen display region 53b in screen display frame 53, the same screen information as the operation screen displayed on device display 25 of component mounting machine M6 is displayed.

By using management input unit 35 of management computer 3 (remote terminal), the remote operator operates the operation screen of component mounting machine M6 displayed on remote operation screen 51, thereby remotely operating component mounting machine M6. That is, the remote operator can perform cause inspection of the mounting inspection error by the remote terminal.

Next, a method of granting authority in component mounting system 1 (manufacturing system) will be described along the flow of FIG. 5. In a plurality of manufacturing facilities MP of component mounting system 1, device monitor 23 of manufacturing facility MP monitors occurrence of device error (ST1: error monitoring process). When the device error is detected (Yes in ST1), device monitor 23 transmits error information 22a to management computer 3 (ST2: error information transmission process), and management computer 3 manages received error information 22a as error information 31b and stores the error information in management storage 31 (ST3: error information reception process).

Next, error causing facility specifier 33 determines whether the detected device error is a defect of inspection result (solder inspection error or mounting inspection error) based on error information 31b (ST4). That is, it is determined whether the cause of the detected device error is in the first manufacturing facility (No) or in the second manufacturing facility (Yes). In a case where the device error is not a defective inspection result (No in ST4), remote authority controller 34 grants the remote operation authority of the first manufacturing facility that has detected the device error to management computer 3 (remote terminal) (ST5: first remote operation process).

Figure 5:
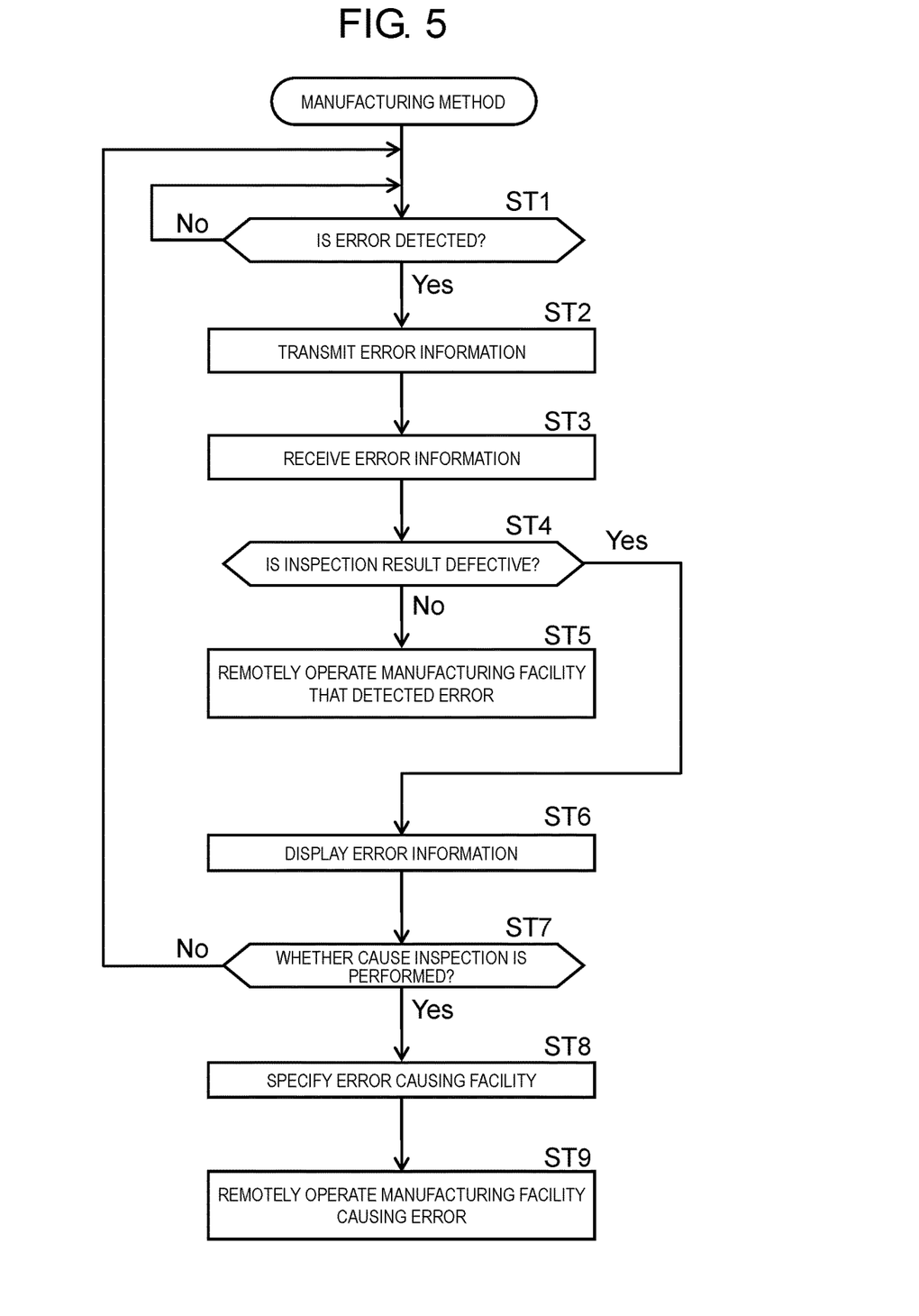
FIG. 5 is a flowchart of a method of granting authority in the component mounting system according to the embodiment of the present disclosure.

In FIG. 5, in a case where the detected device error is a defective inspection result (Yes in ST4), remote authority controller 34 causes management display 36 to display the information of the device error detected by the first manufacturing facility (ST6: error information display process). That is, in a case where the device error is detected in the first manufacturing facility among the plurality of manufacturing facilities MP (Yes in ST1), the information on the device error detected in the first manufacturing facility is displayed on management display 36 (display) (ST6) (refer to FIG. 3).

Next, it is determined whether to inspect the cause (ST7). For example, in a case where "Yes" button 42c is operated on post-mounting inspection result screen 41 illustrated in FIG. 3, it is determined to inspect the cause (Yes in ST7). In the cause investigation, first, error causing facility specifier 33 specifies the second manufacturing facility that caused the device error (ST8: error cause facility specification process). Next, remote authority controller 34 grants the remote operation authority of the specified second manufacturing facility to management computer 3 (remote terminal) (ST9: second remote operation process).

In this manner, when any one of the device error information items displayed on management display 36 (display) is selected by management computer 3 (remote terminal) (Yes in ST7), the remote operation authority of the second manufacturing facility, which causes the selected device error, is granted to management computer 3. That is, when a remote operator selects a component to be causing inspected by operating result display region 42 (FIG. 3) displayed on management display 36, screen display frame 53 (FIG. 4) of the second manufacturing facility that caused the device error is displayed.

In a case where the device error is a defective inspection result (Yes in ST4), remote operation screen 51 (FIG. 4) may be displayed on management display 36 by granting the remote operation authority of the second manufacturing facility to the remote terminal without displaying post-mounting inspection result screen 41 (ST6) and selecting whether or not to inspect the cause (ST7). That is, when the device error is detected, screen display frame 53 (FIG. 4) of the second manufacturing facility that caused the device error may be displayed on management display 36 immediately. In a case where the cause inspection is not performed (No in ST7), the process returns to the error monitoring process (ST1) and the occurrence of the device error is monitored.

In this manner, in the method of granting authority according to the present embodiment, in a case where the error is detected in the first manufacturing facility out of a plurality of manufacturing facilities MP (Yes in ST1), the remote operation authority (remote operation authority) of the second manufacturing facility other than the first manufacturing facility that caused the device error is granted to the remote terminal (management computer 3) (ST9). Accordingly, it is possible to smoothly perform the remote operation when the device error is detected.

Figure 6:
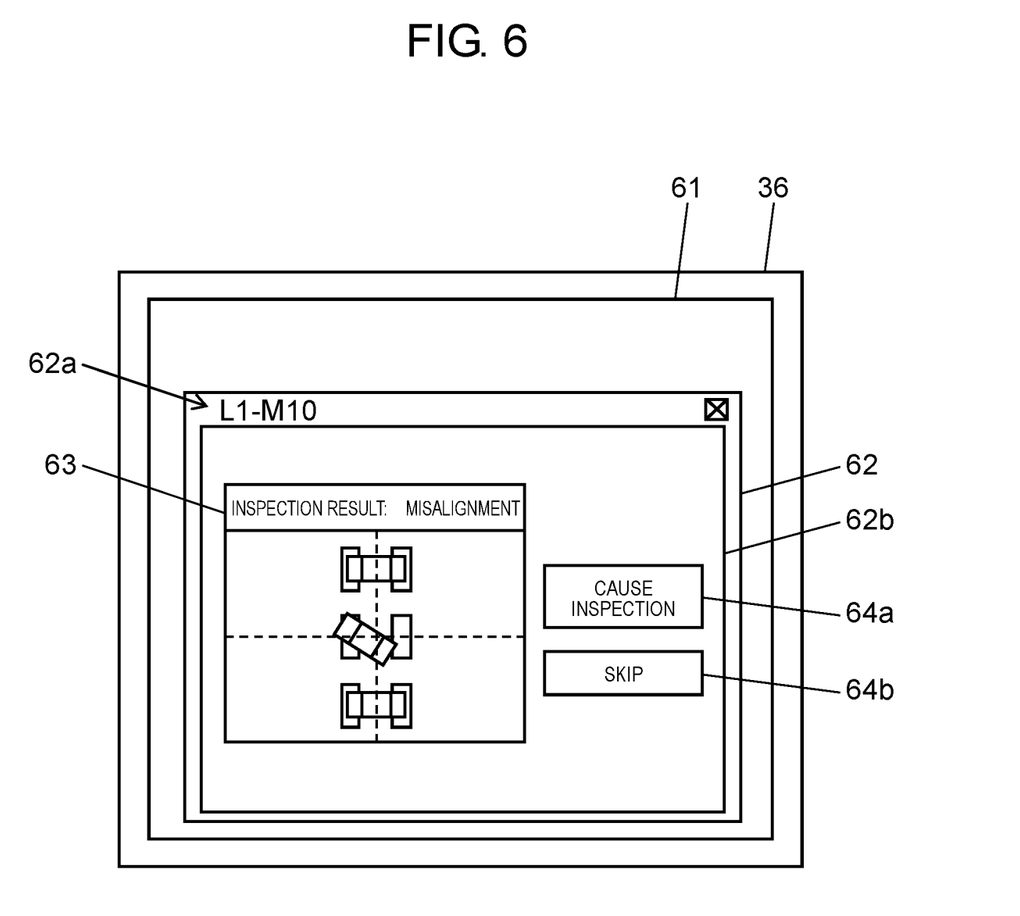
FIG. 6 is an explanatory diagram illustrating an example of a screen for remotely operating a post-mounting inspection machine displayed on the display of the remote terminal included in the component mounting system of the embodiment of the present disclosure.

Next, with reference to FIG. 6, another embodiment of granting the remote operation authority of the second manufacturing facility to management computer 3 (remote terminal) when the device error is detected will be described. In another embodiment, in a case where the device error is a defective inspection result (Yes in ST4), in the error information display process (ST6), the operation screen (FIG. 6) of the first manufacturing facility that detected the defective inspection result in management display 36 is displayed in the error information display process (ST6). In FIG. 6, remote operation screen 61 for operating the operation screen of post-mounting inspection machine M10 that detected the inspection result defect (mounting inspection error) is displayed on management display 36.

Screen display frame 62 is displayed on remote operation screen 61. Character 62a ("L1-M10" here) for specifying manufacturing facility MP to be remotely operated is displayed in the upper left portion of screen display frame 62. In screen display region 62b in screen display frame 62, the same screen information as the operation screen displayed on device display 25 of post-mounting inspection machine M10 is displayed.

In screen display region 62b, image pickup result 63, "cause inspection" button 64a, and "skip" button 64b including components with mounting inspection errors imaged by the component inspection cameras included in post-mounting inspection machine M10 are displayed.

When "inspection cause" button 64a is operated, the second remote operation process (ST9) is executed. That is, error causing facility specifier 33 specifies which of component mounting machines M5 to M8 (the second manufacturing facility) which caused the mounting inspection error, remote authority controller 34 grants the remote operation authority of the specified second manufacturing facility to management computer 3 (remote terminal). Accordingly, remote operation screen 51 (for example, FIG. 4) is displayed on management display 36 of management computer 3. In addition, when "skip" button 64b is operated, the cause inspection is not performed and the display of screen display frame 62 is ended.

In this manner, in another embodiment, remote authority controller 34 causes management display 36 (display) to display information on the error detected by the first manufacturing facility (post-mounting inspection machine M10) (refer to FIG. 6). When a predetermined operation is executed by management computer 3 (remote terminal), the remote operation authority of the second manufacturing facility that caused the error (mounting inspection error) is granted to the remote terminal.

That is, when the remote operator selects execution of the cause inspection by operating screen display frame 62 (FIG. 6) of post-mounting inspection machine M10 displayed on management display 36, screen display frame 53 (for example, FIG. 4) of the second manufacturing facility which automatically caused the device error is displayed. Accordingly, it is possible to smoothly perform the remote operation when the device error is detected.

As described above, management computer 3 of the present embodiment is a remote terminal for performing remote operation of at least one of the plurality of manufacturing facilities MP. Component mounting system 1 is a manufacturing system including a plurality of manufacturing facilities MP, a remote terminal (management computer 3), and remote authority controller 34 for controlling the authority of remote operation by the remote terminal, in which in a case where the error is detected in the first manufacturing facility among the plurality of manufacturing facilities MP, remote authority controller 34 grants the authority of the remote operation of the second manufacturing facility that caused the error to the remote terminal. Accordingly, it is possible to smoothly perform the remote operation when the device error is detected.

Above-described component mounting system 1 (manufacturing system) has a configuration in which management computer 3 including remote authority controller 34 also serves as a remote terminal. However, it is not limited to this configuration. For example, component mounting system 1 may be configured to have a computer different from management computer 3 having remote authority controller 34 as a remote terminal.

The manufacturing system and the method of granting authority of the present disclosure have an effect that it is possible to smoothly execute a remote operation when the error is detected and it is useful in a component mounting field where components are mounted on a substrate.

What is claimed is:

1. A manufacturing system comprising:
    a plurality of manufacturing facilities for performing a series of processes on a substrate;
    an inspection facility configured to detect at least one error on the substrate, the at least one error caused by the inspection facility or one of the plurality of manufacturing facilities;
    a remote terminal; and
    a main processor configured to:
        determine whether the at least one error was caused by the inspection facility or one of the plurality of manufacturing facilities;
        when the at least one error was caused by the inspection facility, allow the remote terminal to perform a remote control operation with the inspection facility; and
        when the at least one error was caused by one of the plurality of manufacturing facilities:
            provide a list of the at least one error detected by the inspection facility, each error caused from one of the plurality of manufacturing facilities;
            receive a selection on one of the list of at least one error; and
            determine a manufacturing facility that caused the selected error, among the plurality of manufacturing facilities,
        wherein the remote terminal is configured to initiate a remote control operation with the manufacturing facility that caused the selected error.

2. The manufacturing system of claim 1, wherein the processor is further configured to specify the manufacturing facility that caused the selected error.

3. The manufacturing system of claim 1,
    wherein the remote terminal includes a display, and
    wherein the processor is configured to cause the display to display the list of the errors detected in the inspection facility.

4. The manufacturing system according to claim 3,
    wherein the selection on one of the list of the errors is received from the remote terminal.

5. The manufacturing system of claim 1,
    wherein the plurality of manufacturing facilities include a solder printing machine that prints solder on a substrate, and
    wherein the inspection facility includes a post-printing inspection machine that inspects a printing state of the solder printed on the substrate.

6. The manufacturing system of claim 1,
    wherein the plurality of manufacturing facilities include a component mounting machine that mounts a component on a substrate, and
    wherein the inspection facility includes a post-mounting inspection machine that inspects a mounting state of the component mounted on the substrate.

7. The manufacturing system of claim 1, wherein each of the list of the at least one error displayed on a screen includes an index number of a component with which an error is detected and a type of the error, and a selection option for allowing a user to select whether to conduct an inspection to identify which one of the plurality of manufacturing facilities caused each error or to skip the inspection.

8. A method for operating a manufacturing system including a plurality of manufacturing facilities for performing a series of processes on a substrate, an inspection facility, and a remote terminal, the method comprising:
    detecting at least one error on the substrate, each error caused from the inspection facility or one of the plurality of manufacturing facilities;
    determining whether the at least one error was caused by the inspection facility or one of the plurality of manufacturing facilities;
    when the at least one error was caused by the inspection facility, allowing the remote terminal to perform a remote control operation with the inspection facility; and
    when the at least one error was caused by one of the plurality of manufacturing facilities:
        providing a list of the at least one error detected by the inspection facility;
        receiving a selection on one of the list of at least one error;
        determining a manufacturing facility that caused the selected error, among the plurality of manufacturing facilities; and
        initiating, by the remote terminal, a remote control operation with the manufacturing facility that caused the selected error.

9. The method of claim 8,
    wherein the selection on one of the list of at least one error is received from the remote terminal.

10. The method of claim 8,
    wherein the remote terminal includes a display, and wherein the list of the at least one error detected in the inspection manufacturing facility is displayed on the display of the remote terminal.

11. The method of claim 10,
wherein the one of the list of at least one error displayed on the display is selected by the remote terminal.

12. The method of claim 8,
wherein the plurality of manufacturing facilities include a solder printing machine that prints solder on a substrate, and
wherein the inspection facility includes a post-printing inspection machine that inspects a printing state of the solder printed on the substrate.

13. The method of claim 8,
wherein the plurality of manufacturing facilities includes a component mounting machine that mounts a component on a substrate, and
wherein the inspection facility includes a post-mounting inspection machine that inspects a mounting state of the component mounted on the substrate.

14. The method of claim 8, wherein each of the list of the at least one error displayed on a screen includes an index number of a component with which an error is detected and a type of the error, and a selection option for allowing a user to select whether to conduct an inspection to identify which one of the plurality of manufacturing facilities caused each error or to skip the inspection.

* * * * *